United States Patent [19]

Marbot

[11] Patent Number: 5,463,343
[45] Date of Patent: Oct. 31, 1995

[54] ADJUSTABLE DELAY CIRCUIT OF THE CURRENT INTENSITY HAVING DELAY AS A HYPERBOLIC FUNCTION

[75] Inventor: Roland Marbot, Versailles, France

[73] Assignee: Bull, S.A., Paris, France

[21] Appl. No.: 809,181

[22] Filed: Dec. 18, 1991

[30] Foreign Application Priority Data

Dec. 27, 1990 [FR] France .................................. 90 16339

[51] Int. Cl.[6] ...................... H03H 11/26; H03H 17/296; H03H 17/28
[52] U.S. Cl. .......................... 327/270; 327/271; 327/272; 327/274; 327/393; 327/394; 327/395; 327/400
[58] Field of Search ..................... 307/591, 595, 307/597, 602, 603, 605, 608; 328/55, 66; 327/393, 394, 395, 400, 261, 264, 266, 270, 272, 274, 271

[56] References Cited

U.S. PATENT DOCUMENTS

| | | | |
|---|---|---|---|
| 4,422,052 | 12/1983 | Yorkanis et al. | 330/295 |
| 4,709,170 | 11/1987 | Li | 328/55 |
| 4,797,586 | 1/1989 | Traa | 328/55 |
| 4,862,020 | 8/1989 | Cowan et al. | 307/603 |
| 4,866,314 | 9/1989 | Traa | 328/55 |
| 4,893,036 | 1/1990 | Hester et al. | 307/605 |

FOREIGN PATENT DOCUMENTS

| | | |
|---|---|---|
| 239696 | 10/1987 | European Pat. Off. . |
| 315385 | 5/1989 | European Pat. Off. . |

Primary Examiner—Timothy P. Callahan
Assistant Examiner—Trong Phan
Attorney, Agent, or Firm—Kerkam, Stowell, Kondracki & Clarke; Edward J. Kondracki

[57] ABSTRACT

The delay device 10 includes an ECL gate 11, the current source 16 and two resistive load elements 14, 15 of which are associated with an adjusting circuit 23 producing an adjusting voltage Vd, to cause the polarization current of the current source to vary hyperbolically, and a voltage Vh for keeping constant the voltage at the collectors of the transistors 12 and 13 of the gate 11. The delay device 10 causes the delays between the input signals IN, IN* and output signals OUT, OUT* to vary linearly. The invention is applicable in particular to systems for the transmission of digital data at a very high rate, of more than 1 gigabit per second, for example.

19 Claims, 6 Drawing Sheets

3 
ADJUSTABLE DELAY CIRCUIT OF CURRENT INTENSITY HAVING DELAY AS A HYPERBOLIC FUNCTION

RELATED APPLICATIONS

This application is related to my co-pending application Ser. No. 07/809,179 (BULL 3272) for ADJUSTABLE DELAY DEVICE filed concurrently herewith. The subject matter of said application is incorporated herein by reference.

FIELD OF THE INVENTION

The subject of the invention is an adjustable delay device. It applies in particular to systems for transmitting digital data at a very high rate, of more than one gigabit per second, for example.

BACKGROUND OF THE INVENTION

Current delay devices are presently made of RC circuits. Adjusting the delay is done by varying the resistance and/or capacitance. In an integrated circuit with field effect transistors, for instance of the MOS (metal oxide semiconductor) type, the resistance and capacitance are ordinarily constituted by transistors.

The disadvantage of such delay devices is the exponential curve of the variation in the delay with respect to the variation of the value of R and C. The linearity of the adjustment of the delay accordingly requires high-resistance and high-capacitance RC products, and this is incompatible with very short delay times. On the other hand, RC circuits must be inserted between input and output buffer circuits, making the external circuits insensitive to variations in R and C. Moreover, the technology for manufacturing field effect transistors engenders major fluctuations in the characterics of the transistors of different integrated circuits. These fluctuations are an obstacle to the desired reliability and fineness of the delay adjustment.

OBJECT AND SUMMARY OF THE INVENTION

The invention introduces an adjustable delay device that offers the advantages of not having a logarithmic variation curve, of producing very short delays, of very finely and reliably adjusting the value of the delays, and of having a simple structure that is well adapted to being integrated into BiCMOS (bipolar/complementary MOS) integrated circuits without requiring input and output buffer circuits.

An adjustable delay device according to the invention is characterized in that it includes at least one differential amplifier, the current source and the two resistive load elements of which are associated with adjusting circuit causing the polarization current of the current source to vary hyperbolically and maintaining the product of this current and the resistance of each of the load elements constant.

The characteristics and advantages of the invention will become apparent from the ensuing detailed description, given by way of example, taken in conjunction with the drawings.

DESCRIPTION OF THE PREFERRED EMBODIMENTS

Figure 1:
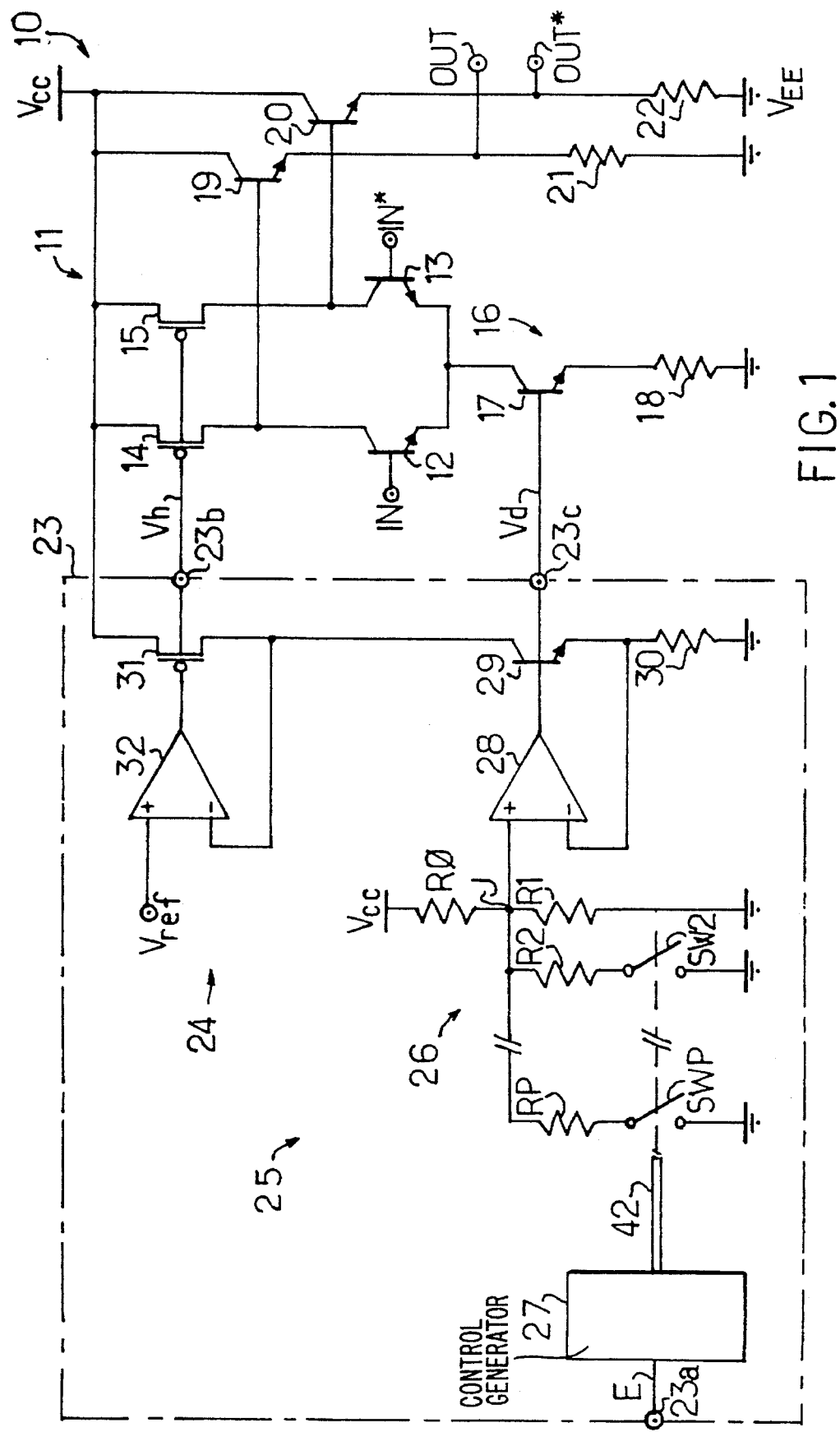
FIG. 1 is a schematic view of the circuit of a preferred embodiment of an adjustable delay device according to the invention.

In FIG. 1, the delay device 10 according to the invention is made beginning with an ECL (emitter-coupled logic) gate 11. It is supplied with voltage between the potentials $V_{CC}$ and $V_{EE}$, having values of +5 V and ground, for example. The two input bipolar transistors 12 and 13 of the gate 11 receive the direct input signal IN and the inverted input signal IN*, respectively, at their bases. Their collectors are connected to the potential $V_{CC}$ by way of respective resistive loads 14 and 15. Their emitters are joined and connected to the potential $V_{CC}$ by a current source 16 made of a bipolar transistors 17 and a resistor 18. The transistor 17 has its collector connected to the emitters of the transistors 12 and 13, its emitter connected to the resistor 18, and its base receiving an adjusting potential Vd. The collectors of the transistors 12 and 13 are also connected to the bases of two transistors 19 and 20 that form two emitter-follower output amplifiers. Their collectors are connected to the potential $V_{CC}$ and their emitters are connected to the potential $V_{EE}$ by respective resistive elements 21 and 22 and furnishing the direct and inverted output signals, OUT and OUT*, respectively. In the conventional manner, the resistive elements 21, 22 may be made of respective MOS-type transistors. The resistive elements 14 and 15 are made of PMOS transistors, the drain-to-source paths of which connect the potential $V_{CC}$ to the collectors of the respective transistors 12 and 13 and their gate electrodes connected to a holding potential Vh. In practice, the resistor and elements 18, 21 and 22 are also ordinarily NMOS transistors (not shown), having their drain-to-source paths connecting ground to the emitters of the respective transistors 17, 19 and 20 and having their gate electrodes connected to a predetermined potential.

According to the invention, the ECL gate 11 is associated with an adjusting circuit 23 that causes the polarization current I, produced by the source 16, to vary hyperbolically and keeping the product of the current and the resistance of each of the load resistors 14 and 15 at a constant value.

The adjusting circuit 23 has one input terminal 23a and two control terminals 23b and 23c. The input terminal 23a receives an external control signal E. The control terminals 23b and 23c respectively furnish the holding potential Vh and the adjusting potential Vd. The adjusting circuit 23 includes a holding generator 24, supplying the control terminal 23a, and an adjusting generator 25, supplying the control terminal 23b and incorporating a voltage divider 26 and a control generator 27. The control generator 27 receives the external control signal E and produces P—1 selection signals SS2-SSP (not shown) routed along a bus 42. The voltage divider 26 is disposed between the potentials $V_{CC}$ and $V_{EE}$ and is composed of a base resistor R0 in series with a plurality P of resistors R1-RP connected in the respective parallel branches. The P—1 resistors R2-RP are selectively connected to ground by respective switches SW2-SWP controlled by the corresponding selection signals SS2-SSP. The junction of the branches with the base resistor R0 forms the node J. The adjusting generator 25 includes an operational amplifier 28 the positive input of which is connected to the node J, a transistor 29, and an emitter resistor 30. The transistor 29 has its base connected to the output of the operational amplifier 28, its emitter connected to ground via the resistor 30, and its collector connected to the potential $V_{CC}$ via a resistive element 31 formed by a PMOS transistor. The holding generator 24 includes an operational amplifier 32, the positive input of which receives the reference voltage $V_{REF}$ and the negative input of which is connected to the collector of the transistor 29 and the output of which is applied to the gate electrodes of the PMOS transistors 14, 15 and 31.

Figure 2:
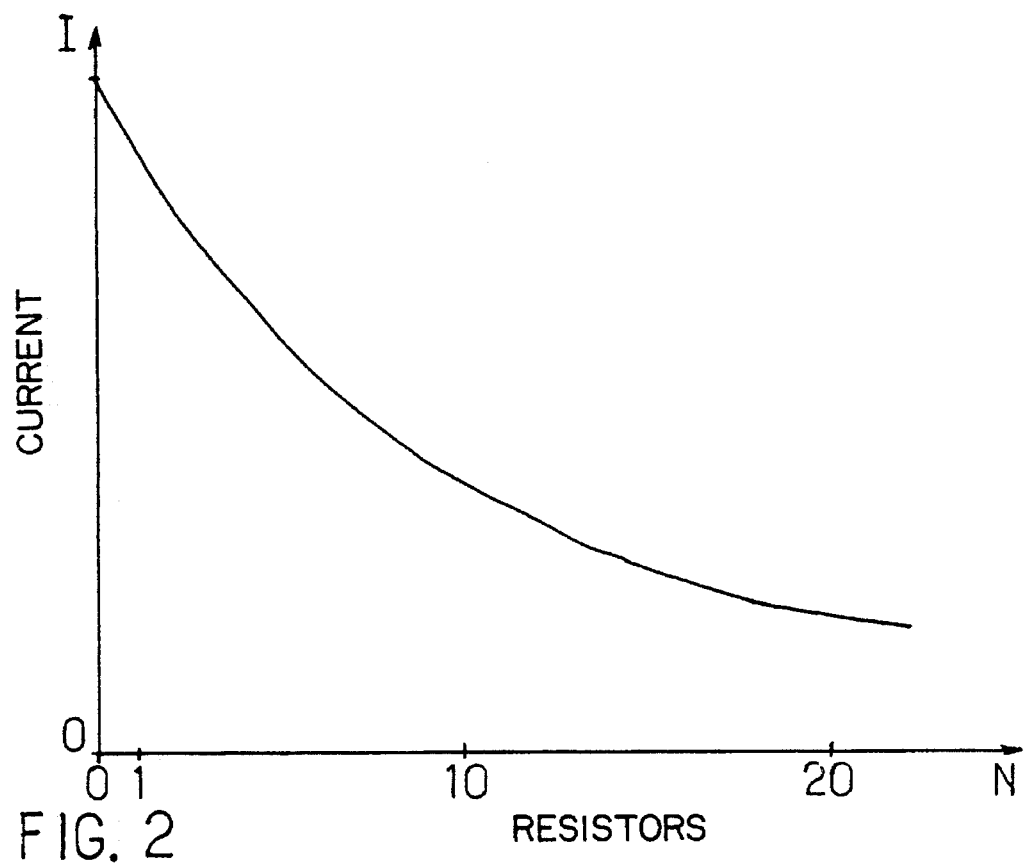
FIG. 2 is a graph illustrating the hyperbolic variation of the polarization current of the delay device shown in FIG. 1.
Figure 3:
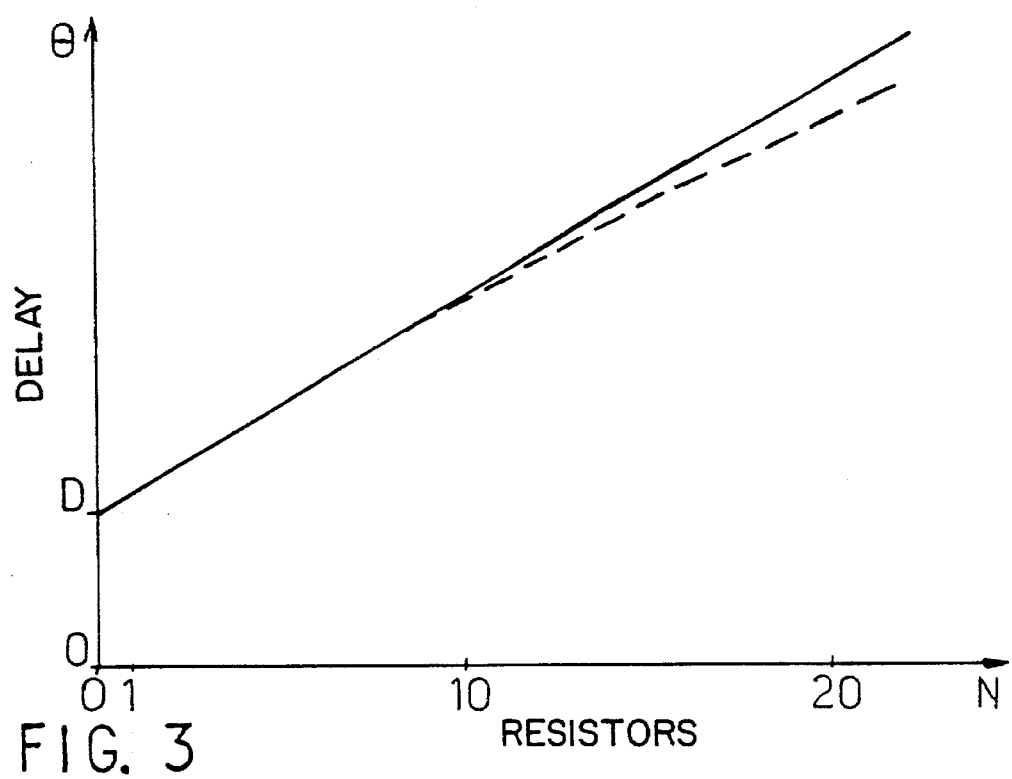
FIG. 3 is a graph illustrating the linear variation of the delay Θ produced by the device shown in FIG. 1.

The operation of the adjustable delay device 10 shown in FIG. 1 will now be described with reference to the graph in FIGS. 2 and 3. The graph of FIG. 2 shows the variations in the polarization current I produced by the current source 16 as a function of the variation in the number N of resistors connected in parallel among the P resistors R1-RP of the voltage divider 26. Hence this voltage divider functions as a digital/analog converter. The graph in FIG. 3 shows the variations in the delay e of the output signals OUT and OUT* with respect to the input signals IN and IN* as a function of the variations in the number N. The control generator 27 determines the number N by producing N selection signals SS2-SSN closing the switches SW2-SWN. R represents the control value of each resistor, kR represents the resistance of the base resistor R0, and β represents the ratio R0/R1, where k and β are two arbitrary positive numbers, and Rs is the resistance of the resistor 18 of the current source 16, which is equal to that of the resistor 30. Under these conditions, the adjusting voltage Vd corresponds to that of the point J; hence $$Vd=V_{cc}/(kN+\beta+1)$$

Moreover, the holding generator 24 assures that the voltage Vh is held at a value such that the potential at the drains of the transistors 14, 15 and 31 is equal to the reference voltage $V_{REF}$. Consequently, the intensity I of the current passing through the transistor 29 or the transistor 17 is $$I=V_{cc}/Rs(kN+\beta+1)$$

The current I thus varies in accordance with a hyperbolic principle of the type A/(BN+C), where A, B and C are predetermined coefficients. One such variation is shown in the graph of FIG. 2. The line plotting the variation in the delay Θ as a function of N causes a straight line of the type Θ=CN+D to appear in FIG. 3.

The delay device 10 according to the invention has several advantages. The major advantage is the linear variation of the delay Θ at very high frequencies. The presence of bipolar transistors as active elements in the ECL gate 11 lends a reliability and homogeneity of the delay times Θ. It overcomes problems of nonhomogeneity which would be present in a differential amplifier of the CMOS type (complementary MOS) because of the notable difference in the delays in the NMOS and PMOS transistor with respect to the very short delay times Θ of the via-hole of the delay device 10, on the order of 250 ps in the example shown. Another advantage is in the use of complementary input signals IN and IN* at the bases of the transistors 12 and 13 of the ECL gate 11. In fact, the use of the input signal IN and a reference voltage would present a problem of centering the edge of the signal IN at the reference voltage because of the fluctuation in characteristics of components among different integrated circuits. A shift in centering would produce non-homogeneous delays Θ. Contrarily, in the example shown, the centering is done at the point of intersection of the edges of complementary input signals, which compensates for any fluctuation and assures a stable delay time.

Numerous variants may be made by one skilled in the art using the embodiment shown as an example. In particular, experience shows that the presence of operational amplifiers 28 and 32 substantially increases the response time of the delay device 10 and presents a problem of parasitic oscillations, and another problem in realization of the holding generator 24 because of the wide range of variation of the negative input voltage applied to the operational amplifier 32. For very high frequencies, greater than 1 gigabit per second, for example, the embodiment shown in FIG. 4 overcomes these problems and constitutes the preferred embodiment of the invention.

Figure 4:
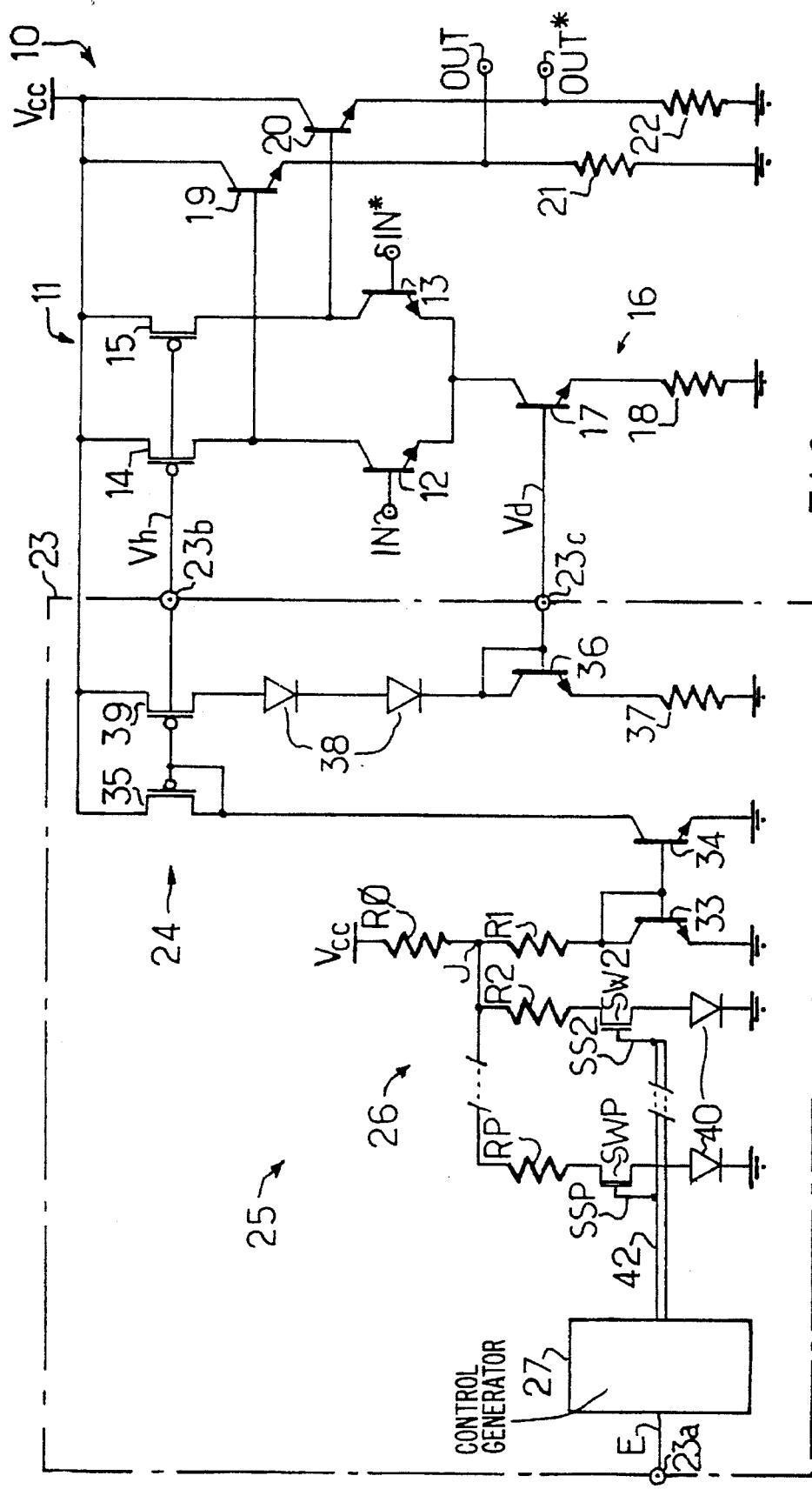
FIG. 4 is a schematic view of another embodiment of a delay device according to the invention.

The delay device 10 shown in FIG. 4 uses an ECL gate 11 and an adjusting circuit 23. For this reason, the same reference numerals indicate the same functionalities as in the delay device shown in FIG. 1. The essential difference resides in the structure of the holding generator 24 and of the adjusting generator 25. The voltage divider 26 includes a bipolar transistor 33 wired as a diode, with its emitter at ground and its collector connected to its base and joined to the point J by the stop resistor R1. The emitter of a bipolar transistor 34 is connected to ground, and its collector is connected to the potential $V_{CC}$ via the drain-to-source path of a PMOS transistor 35 the gate electrode and source of which are joined and furnish the holding potential Vh. The emitter of a bipolar transistor 36 wired as a diode is connected to ground via a resistor 37; its base is common with that of the transistor 17 of the current source 16 of the ECL gate 11, and its connector is joined to the potential $V_{CC}$ successively by two diodes 38 and by a resistor 39 comprising a PMOS transistor 39 having its gate electrode connected to the holding potential Vh. The voltage Vbe of the base-to-emitter junction of the transistor 33 is compensated for in all the other branches of the voltage divider 26 by the addition of a diode junction 40.

The basic function of the adjusting circuit 23 comprises reproducing the current I through the resistor R1 of the voltage divider 26. This reproduction is accomplished first by a first current mirror, composed of the transistors 33 and 34. With the transistor 35, this current mirror forms the holding generator 24 that furnishes the holding voltage Vh to the load resistors 14, 15 and 39. The current I is then reproduced by a second current mirror composed of the PMOS transistors 35 and 39. It is reproduced again by a third current mirror composed of the transistors 36 and 17. Thus the current I of the current source 16 is defined in the voltage divider 26 by the stop resistance R1, by the following formula:

$$I=(V_{cc}-Vbe)R1(kN+\beta+1)$$

Accordingly, this current I varies in accordance with a hyperbolic law of the type A/(BN+C), similar to that shown in FIG. 2. Hence the delay time Θ varies in the manner shown in FIG. 3. In practice, the holding voltage Vh fluctuates slightly, essentially from the drain conductance effect of the PMOS transistors of the second current mirror. This mirror is accordingly not perfect and causes a slight variation (voltage swing) in the collector voltage of the transistors 12 and 13 of the ECL gate 11 to appear. The polarization current I in the gate 11 is accordingly slightly deformed. The result is a variation curve that differs progressively from the theoretical straight line, as indicated by a dashed line in FIG. 3. However, the delay device 10 shown in FIG. 4 affords the advantage of being well-adapted to very high frequencies and of having a simple and easily integratable structure.

The delay time Θ produced by the devices 10 shown in FIGS. 1 and 4 can thus be adjusted linearly within a maximum predetermined range DL, of 250 ps, for example. If the delay times desired exceed the capacities of a single delay device 10, then it is also possible to add a plurality of ECL gates 11 in the manner shown in FIG. 5.

Figure 5:
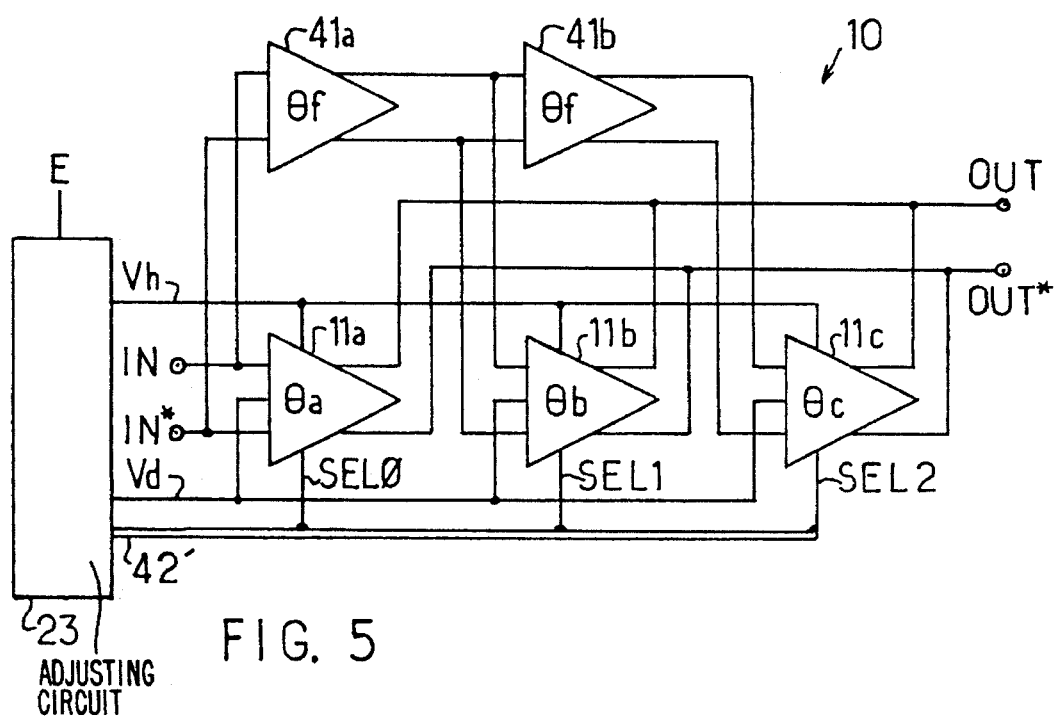
FIG. 5 is a block diagram of a variant embodiment of a delay device according to the invention, having a linear delay that is adjustable over a wide range of variation.
Figure 7:
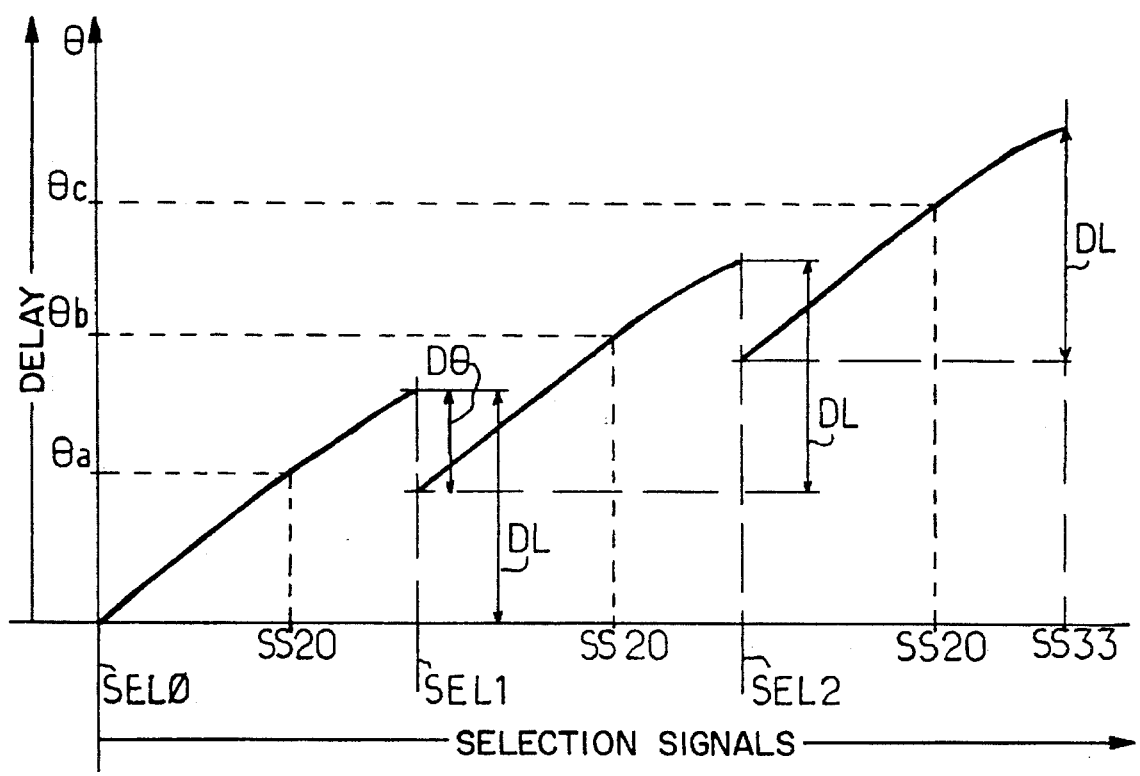
FIG. 7 is a graph illustrating a curve of the variation in the delay produced by the device shown in FIG. 6.
Figure 6A:
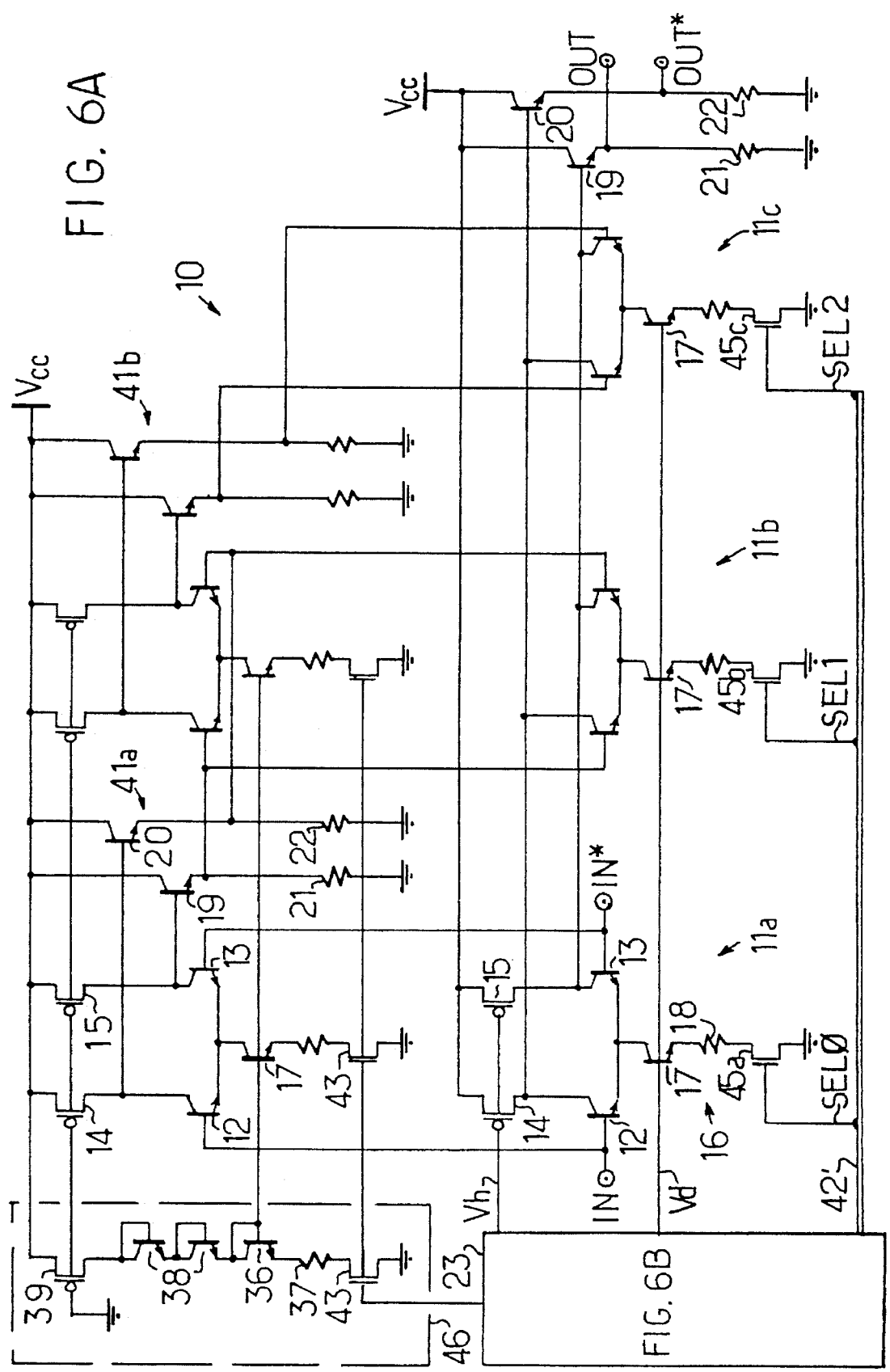
FIGS. 6A, 6B are is a schematic view of an exemplary embodiment of the delay device shown in FIG. 5.
Figure 6B:
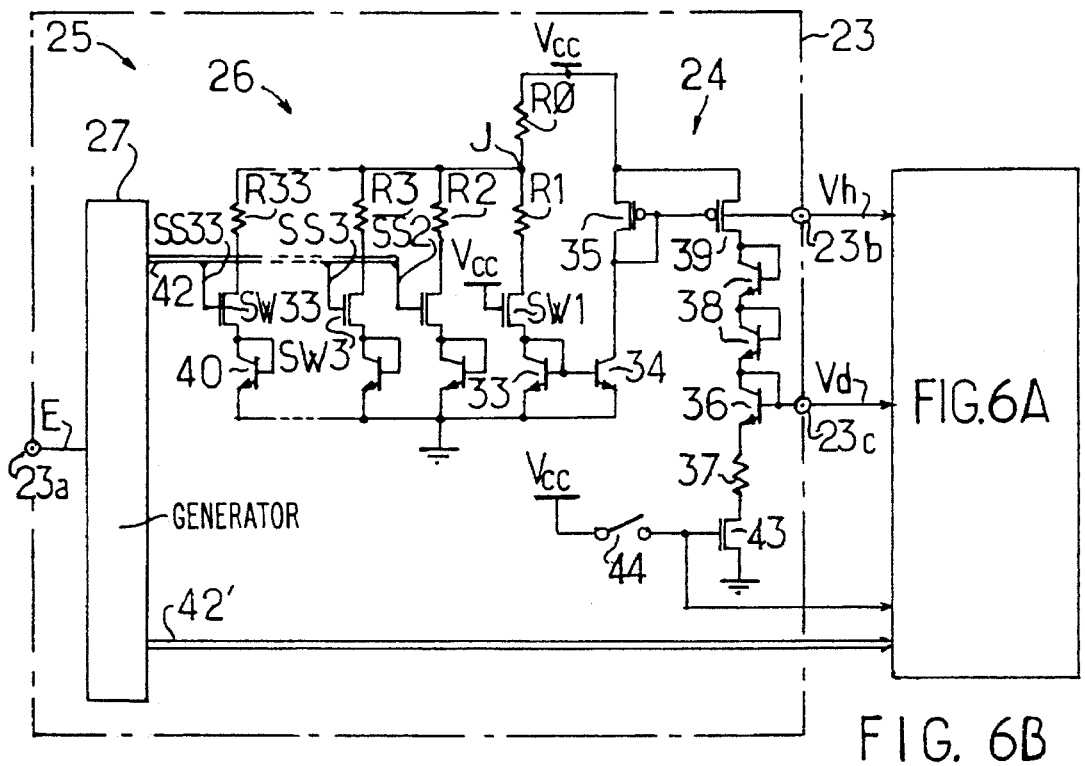

FIG. 5 is a block diagram showing the structure of the delay device 10 according to the invention, which affords the advantage of substantially linearly delaying the input signals over a wide range of values. This delay device generally incorporates a plurality of ECL gates. In the example shown in FIG. 5, the delay device 10 is composed of three ECL gates 11a–11c with adjustable delay and two ECL gates 41a, 41b that delay their input signals by the same fixed value Θf. The gates 11a–11c are controlled by the same adjusting circuit 23 and are activated by respective selection signals SEL0-SEL2 routed over a bus 42' originating in the adjusting circuit 23. FIG. 6 (6A, 6B) shows a preferred exemplary embodiment of the delay device 10, shown basically in FIG. 5, and FIG. 7 shows a preferred form of the variation curve of the resulting delays. Elements that have identical or equivalent functions in the delay devices 10 shown in FIGS. 4, 5 and 6 have the same reference numerals.

In the delay device 10 of FIG. 6 (6A, 6B), the adjusting circuit 23 has a structure similar to that of FIG. 4. More precisely, the maximum number P of resistors that can be selected in the voltage divider 26 is 32, identified by reference numerals R2-R33 and selected by the respective switches SW2-SW33 reacting to the corresponding selection signals SS2-SS33. Under these conditions, the control generator 23 may simply be a 32-bit shift register for the digital control of the 32 switches. Each diode junction 40 is conventionally constituted by the base-to-emitter junction of a bipolar transistor. The stop resistor R1 is also provided with a switch S1 that is always closed. The adjusting circuit 23 also includes the same three current mirrors 33, 34; 35, 39; 36, 17, and the resistor 37 and the diodes 38. All that is added is one NMOS transistor 43, having its source connected to ground and its gate electrode at the potential VCC, via a switch 44.

The three gates 11a–11c are similar to the gate in FIG. 4. Their two bipolar transistors 12, 13 share the same respective resistive load elements 14, 15, made of PMOS transistors having their gate electrodes common with those of the PMOS transistors 35 and 39 and thus receiving the holding voltage Vh furnished by the control terminal 23b of the adjusting circuit 23. The current sources 16 of the three gates 11a–11c have their bipolar transistors 17 controlled by the adjusting voltage Vd furnished by the control terminal 23c of the adjusting circuit 23. The resistors 18 are connected in series with respective NMOS transistors 45a–45c having their sources at ground and their gate electrodes receiving the respective selection signals SEL0-SEL2 furnished over the bus 42' connected to one output of the control generator 27. The collectors of the transistors 12 and 13 in the three gates 11a–11c are respectively joined to the bases of the transistors 9 and 20, thus with the resistors 21 and 22 constituting a common output circuit for the three gates 11a–11c.

The two gates 41a and 41b constituting the fixed delay elements are associated with a reference generator 46 and each have a structure similar to that of the three gates 11a–11c, so that the same components carry the same reference numerals. The reference generator 46 thus also has a structure similar to that of the series assembly 36, 37, 38, 39 and 43. However, taking into account the fixed delay that it controls, the gate electrodes of the transistors 39 and 43 of the generator 46 are connected respectively to the potentials of ground and $V_{CC}$, the latter via the switch 44. The transistors 12 and 13 of the gates 11a and 41a have their respective common bases receiving the input signals IN and IN*. The bases of the transistors 12 and 13 of the gates 11b and 41b are also common. The gate electrodes of the PMOS load transistors of the transistors 12 and 13 in the gates 41a and 41b are common with that of the transistor 39 of the generator 46. In the current sources 16, the bases of the transistors 17 are common with that of the transistor 36 of the generator 46. Each current source 16 is also connected in series with an NMOS transistor 43 having its source at ground and its gate electrode common with that of the transistor 43 of the generator 46. The gates 41a and 41b are also each provided with an output circuit identical to that common to the three gates 11a–11c. The complementary outputs of the output circuit of the amplifier 41a are connected to the respective bases of the transistors 12 and 13 of the gates 11b and 41b. Similarly, the complementary outputs of the output circuit of the gate 41b are connected to the respective bases of the transistors 12 and 13 of the gate 11c.

The operating principle of the delay device 10 is clearly apparent from FIGS. 5 and 7. The gates 41a and 41b are always activated and each have the same fixed delay Θf, defined by the voltage delivered by the generator 46. The gates 11a–11c are controlled by the adjusting circuit 23 to cause the delay Θ in each case to vary linearly within the same range of values DL (FIG. 7) and are activated by the corresponding selection signals SEL0-SEL2 originating in the control generator 27. If the control generator 27 activates only the gate 11a, then the output signals OUT and OUT* that it furnishes are delayed by a delay Θa=Θ, within the range DL (FIG. 7). The delay device 10 then functions like that of FIG. 4. If only the gate 11b is activated for a delay adjusted to the value Θ (corresponding for example in these cases to the selection signal SS20), then the input signals IN and IN* first pass through the gate 41a and are then delayed by the fixed value Θf. The output signals OUT and OUT* are then delayed by the value Θd=Θf+Θ. Finally, if only the gate 11c is activated for a delay adjusted to the value Θ, the input signals IN and IN* first pass through the gates 41a and 41b and are then delayed by the fixed value of 2Θf. The output signals OUT and OUT* are then delayed by the value Θc=2Θf+Θ.

It is understood that the curve of variation of the delays furnished by the device 10 would be linear if the fixed delay Θf were equal to DL. In that case, however, a slight variation in the delay about the junction point of two delay ranges, Θa and Θb, for example, would oblige the generator 27 to oscillate in order to activate the corresponding gates 11a and 11b. In FIG. 7, the delay Θf has been selected to be less than the range DL, so that the general curve has a sawtooth shape. The advantage of this curve is in the overlaps DΘ between the delays Θa, Θb and Θc, which make it possible to prevent any oscillation of the generator 27. For example, if the overlap DΘ corresponds to about half of one range DL, at the end of a range DL the control generator 27 can advantageously control the delay beginning at a middle point in the next range. It is thus clear that the general variation in the delay produced by this kind of delay device remains linear despite the sawtoothed curve.

In practice, the selection of the gates 11a–11c in the delay device 10 shown in FIG. 6 is done by activating the corresponding transistors 43a–43c by means of the respective signals SEL0-SEL2 furnished by the generator 27. The transistors 43 act as switches, so that in an integrated circuit that may include numerous other delay devices 10, for example 32 such devices, the gates will not consume current when the delay device 10 is not activated. In such an integrated circuit, only the activated delay devices have their switch 44 closed.

More generally, it is understood that a single one of the gates 11a–11c could be used in a delay device 10 of the type shown in FIG. 6. In that case, the circuits of the delay device must be designed so that the input signals IN and IN* will be delayed by passing through only this single amplifier (delay Θa) and optionally at least one of the amplifiers with a fixed delay Θf. It is thus clear that the number of fixed delays may be arbitrary. In conclusion, the operating principle consists in adding, to a variable delay Θ, at least one fixed delay Θf equal at least to the range DL of variation in the delay Θ. As a variant delay device 10 shown in FIG. 6, the load resistors 14 and 15 would not be common to all the gates 11a–11c and could have different values in the respective gates. In that case, the ranges DL of these gates would have different values and slopes, and each fixed delay Θf would then have to refer to the value of the range DL preceding it. The general curve could then assume various nonlinear shapes, by combining substantially linear variation ranges.

Figure 8:
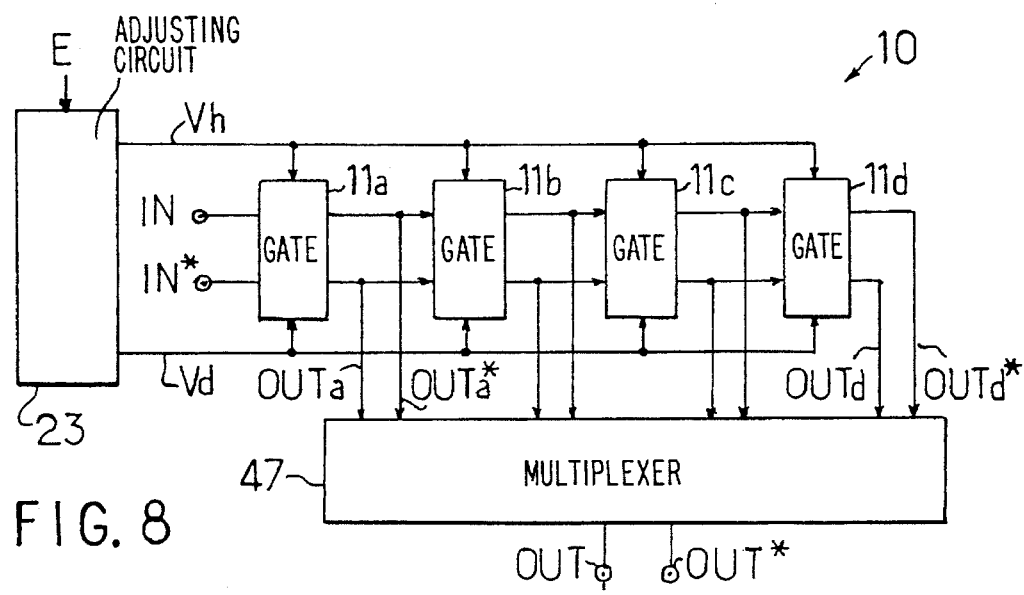
FIG. 8 is a block diagram of a variant embodiment of a delay device according to the invention, having a linear delay that is adjustable over a wide range of variation.

A variant embodiment according to the invention of a delay device with a wide variation range is shown in FIG. 8 in block diagram form. The delay device 10 includes four cascade-connected ECL gates 11a–11d. The gates 11a–11d are controlled by the same adjusting circuit 23 for successively delaying the input signals IN and IN*. Their output signals OUTa-OUTd and OUTa-OUTd* are also applied to the respective inputs of a multiplexer 47, which furnishes the complementary output signals OUT and OUT* of the delay device 10. Knowing that a gate can produce a range of delays DL, with a maximum delay on the order of 250 ps, it is possible to obtain from the delay device 10 a delay Θ that ranges up to a delay on the order of 1 ns, which corresponds to a period for transmitting one bit at the rate of 1 gigabit per second. The example of assembly given in FIG. 8 suffices one skilled in the art for designing others of faster or slower performance as applicable.

Numerous variants of the exemplary embodiments shown may be made. It is clear in particular that instead of an ECL gate shown, a simple differential amplifier, with bipolar and/or field effect transistors could suffice in certain cases. The advantage of an ECL gate resides principally in its very short delays and its performance at high frequency, which in turn are due to the nonsaturation of its transistors 12 and 13 and to the slight variation in its output voltages (voltage swing) as a function of the frequency. It is also apparent from the foregoing description that a simpler or less sophisticated adjusting circuit 23 could cause the delays Θ to vary more or less densely, more or less widely, and more or less linearly. Generally, in an ECL gate 11 or simple substitute differential amplifier, the current source could include only the resistor 18. In that case, or in the cases shown as well, adjusting the polarization current could be done by varying the resistance of the resistor 18. As also seen above, an ECL gate, or the substitute differential amplifier, could receive only the direct input signal IN, while the other input terminal is applied to a predetermined fixed potential. It is also possible for one skilled in the art to cause the delay Θ to vary in a known manner.

What is claimed is:

1. An adjustable delay device (10), comprising at least one differential amplifier (11) having a current source (16) for providing a polarization current (I), two adjustable resistive load elements (14, 15) connected to the current source, an adjusting circuit (23, 25) connected to the current source for varying the polarization current hyperbolically to produce an adjustable delay and maintaining means (23, 25) connected to the current source for maintaining the voltage across each of the adjustable load elements at a substantially constant value ($V_{REF}$).

2. The device of claim 1, characterized in that the current source includes a first transistor (17) connected to an adjusting potential (Vd) controlled by the adjusting circuit to adjust the polarization current.

3. The device of claim 2, characterized in that the adjusting circuit includes control means (27 and a voltage divider (26) including a number (P) of resistors selectively connected in parallel by the control means.

4. The device of claim 3, characterized in that the voltage divider (26) has a node (J) connected to one input of an operational amplifier (28), an output of which controls the conduction of the first transistor (17) of the current source (16).

5. The device of claim 1, characterized in that each of said adjustable load elements is constituted by at least a second transistor, the maintaining means includes an operational amplifier (32) that receives a reference potential ($V_{REF}$) as said constant value and controls the conduction of said second transistor.

6. The device of claim 2, characterized in that, said load elements are constituted by second transistors, the adjusting circuit includes an operational amplifier that receives a reference potential ($V_{REF}$) and controls the conduction of said second transistors.

7. The device of claim 3, characterized in that, said load elements are constituted by second transistors, the adjusting circuit includes an operational amplifier that receives a reference potential ($V_{REF}$) and controls the conduction of said second transistors.

8. The device of claim 4, characterized in that, said load elements are constituted by second transistors, the adjusting circuit includes an operational amplifier that receives a reference potential ($V_{REF}$) and controls the conduction of said second transistors.

9. The device of claim 3, characterized in that one of the resistors (R1) of the voltage divider is connected with at least one current mirror (33, 34; 35, 39; 36, 17) connecting the voltage divider to the control electrode of the first transistor (17) of the current source (16).

10. The device of claim 9, characterized in that the maintaining means comprises a current mirror comprising field effect transistors (35, 39) connected to the adjustable resistive load elements.

11. The device of claim 6, characterized in that the current mirror includes the first transistor (17) of the current source (16).

12. The device of claim 7, characterized in that the current mirror includes the first transistor (17) of the current source (16).

13. The device of claim 1, characterized in that the current source (16) includes an adjustable load resistor (18) adjusted by the adjusting circuit.

14. The device of claim 1, characterized in that the differential amplifier includes two inputs and is connected to receive complementary versions of an input signal (IN) at said inputs.

15. The device of claim 1, characterized in that the differential amplifier is an ECL gate.

16. The device of claim 1, characterized in that it includes a plurality of differential amplifiers (11a–11d), the respective outputs of which are applied to a multiplexer (47).

17. The device of claim 1, characterized in that said differential amplifier produces a first variable delay $\Theta$ and it further comprises means (41a, 41b) for producing at least one fixed delay ($\Theta$f-FIGS. 5 and 7) and selecting means (23, SEL0-SEL2) for selecting one of said at least one fixed delay and adding it to said variable delay to generate at least a second variable delay ($\theta$a, $\theta$b, $\theta$c).

18. The device of claim 17, characterized in that the first and second variable delays have respective overlaps (D$\theta$-FIG. 7).

19. The device of claim 17, characterized in that each of the first and second variable delays is substantially linear.

* * * * *